United States Patent
Chang et al.

(10) Patent No.: US 7,400,698 B2
(45) Date of Patent: Jul. 15, 2008

(54) SHIFT REGISTER CIRCUIT

(75) Inventors: Lee-Hsun Chang, Yunlin County (TW); Yu-Wen Lin, Taichung County (TW)

(73) Assignee: Au Optronics Corp., Hsinchu (TW)

( * ) Notice: Subject to any disclaimer, the term of this patent is extended or adjusted under 35 U.S.C. 154(b) by 119 days.

(21) Appl. No.: 11/466,853

(22) Filed: Aug. 24, 2006

(65) Prior Publication Data
US 2007/0217563 A1    Sep. 20, 2007

(30) Foreign Application Priority Data
Mar. 14, 2006   (TW) ............................... 95108554 A

(51) Int. Cl.
*G11C 19/00* (2006.01)
(52) U.S. Cl. .......................................... 377/64; 377/68
(58) Field of Classification Search .................. 377/64, 377/68, 77–80; 345/100
See application file for complete search history.

(56) References Cited

U.S. PATENT DOCUMENTS

| | | | | |
|---|---|---|---|---|
| 5,434,899 A | * | 7/1995 | Huq et al. ...................... | 377/78 |
| 5,517,542 A | * | 5/1996 | Huq .............................. | 377/78 |
| 5,859,630 A | * | 1/1999 | Huq .............................. | 345/100 |
| 7,317,780 B2 | * | 1/2008 | Lin et al. ....................... | 377/67 |
| 2005/0212746 A1 | * | 9/2005 | Iwasaki et al. ............... | 345/100 |
| 2006/0145998 A1 | * | 7/2006 | Cho et al. ..................... | 345/100 |
| 2006/0227093 A1 | * | 10/2006 | Jang et al. .................... | 345/100 |
| 2007/0086558 A1 | * | 4/2007 | Wei et al. ...................... | 377/64 |

* cited by examiner

Primary Examiner—Tuan T Lam
(74) Attorney, Agent, or Firm—Thomas, Kayden, Horstemeyer & Risley

(57) ABSTRACT

A shift register circuit including a first shift register unit, a second shift register unit, a third shift register unit, and a fourth shift register unit connected in serial. The second shift register unit includes an output terminal, and a pull down system pulling the voltage of the output terminal of the second shift register unit according to a pull down signal. The fourth shift register unit includes a third switch and a fourth switch. The fourth switch has a control terminal electrically coupled to the second terminal of the third switch and the pull down unit. The fourth shift register unit generates the pull down signal according to the voltage level of the connecting point between the third switch and the fourth switch.

18 Claims, 6 Drawing Sheets

SHIFT REGISTER CIRCUIT

BACKGROUND OF THE INVENTION

1. Field of the Invention

The present invention relates to a driving circuit in a liquid crystal display (LCD), and more particularly, to a driving circuit of a shift register circuit in the liquid crystal display.

2. Description of the Related Art

Driving circuits formed on glass bases of liquid crystal displays (LCD) have become a main technology for the future LCD. The advantage thereof is to cost down the driving circuit. FIG. 1 shows a driving circuit of a single shift register unit of a conventional shift register. FIG. 2 is a timing diagram illustrating a driving circuit of the conventional shift register. For simplification, only the driving circuit of the single shift register unit and operation thereof are discussed here.

The conventional shift register circuit uses next stage output signal S(N+1) as a pull down signal of this stage. Pull down system 101 and pull down system 102 are electrically coupled between switch element T22 and low voltage VS for pulling down a voltage of switch element T22, respectively, when clock signals are CK and XCK. When switch element T23 receives a high voltage level clock signal XCK (period t2 in FIG. 2), switch element T23 is turned on and the high voltage level of clock signal XCK is transmitted to control terminal a of switch element T32. At this moment, switch element T32 is turned on. The high voltage level of next stage output signal S(N+1) is transmitted to control terminal b of switch element T30 to turn on switch elements T30 and T29. A control terminal of switch element T22 and this stage output terminal are pulled down to low voltage VS to ensure that output signal S(N) is off status during period T2.

However, the convention pull down mechanism uses next stage output signal S(N+1) to pull down this stage shift register unit. Because next stage output signal S(N+1) has only one duty cycle to pull down shift register unit (period t2 shown in FIG. 2), charges stored in coupled capacitors of switch element T22 cannot be fully discharged. Output signal S(N) is thus unstable when off status and generates voltage drift. In addition, due to the pull down mechanism in period T2, the control terminal of switch element T32 under high voltage clock signal XCK negatively affects switch element T32. Output signal S(N) cannot maintain its off status. Thus, an incorrect image may be displayed on the LCD.

BRIEF SUMMARY OF THE INVENTION

A detailed description is given in the following embodiments with reference to the accompanying drawings.

For displaying the correct image on the LCD, the embodiment of the present invention provides a shift register circuit. The shift register circuit comprises: A first shift register unit comprises a first clock input terminal for receiving a first clock signal, a first input terminal, and a first output terminal. A second shift register unit comprises a second input terminal electrically coupled to the first output terminal, a second clock input terminal for receiving a second clock signal, and a second output terminal. The second shift register unit comprises a first switch element, comprising a first control terminal electrically coupled to the first output terminal, a first terminal, and a second terminal, a second switch element comprising a second control terminal electrically coupled to the second terminal of the first switch element, a first terminal for receiving the second clock signal, and a second terminal electrically coupled to the second output terminal, and a pull down unit, electrically coupled between the second switch element and a reference voltage, for pulling down a voltage level of the second output terminal according to a pull down control signal. A third shift register unit comprises a third clock input terminal for receiving the first clock signal, a third input terminal electrically coupled to the second output terminal, and a third output terminal. A fourth shift register unit comprises a fourth clock input terminal for receiving the second clock signal, a fourth input terminal electrically coupled to the third output terminal, and a fourth output terminal, the fourth shift register unit comprising a third switch element, comprising a third control terminal electrically coupled to the third output terminal, a first terminal, and a second terminal, and a fourth switch element, comprising a fourth control terminal electrically coupled to the second terminal of the third switch element and the pull down unit, a first terminal for receiving the second clock signal, and a second terminal electrically coupled to the fourth output terminal, wherein the fourth shift register unit generates the pull down control signal according to a voltage level of a connected node of the third switch element and the fourth switch element.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
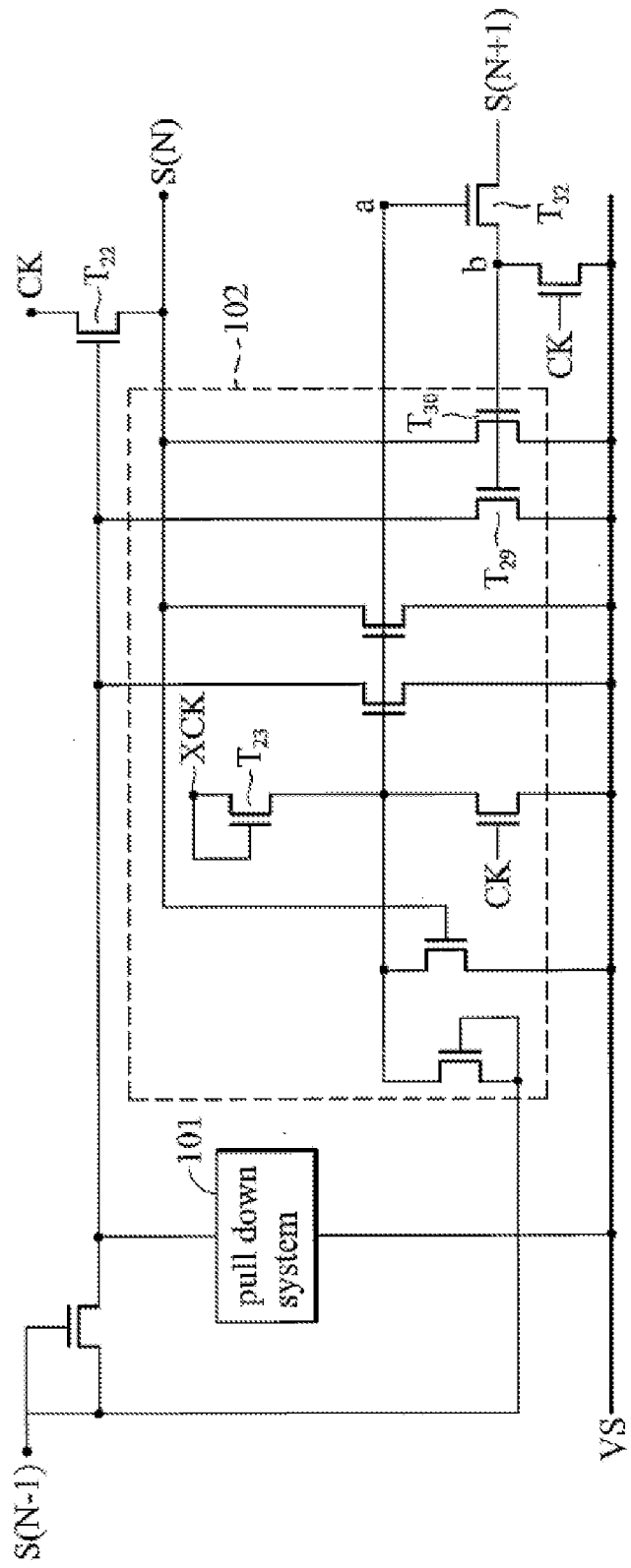
FIG. 1 shows a driving circuit of a single shift register unit of a conventional shift register.
Figure 2:
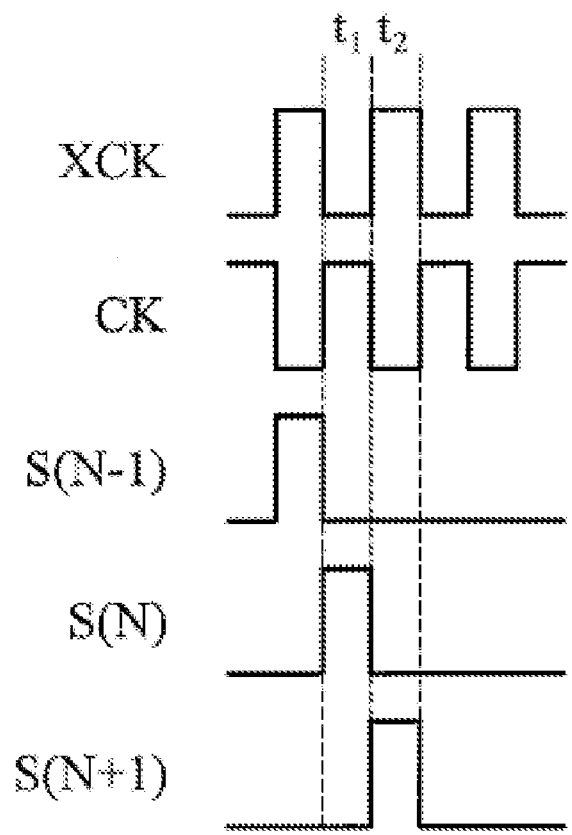
FIG. 2 is a timing diagram illustrating a driving circuit of the conventional shift register.
Figure 3A:
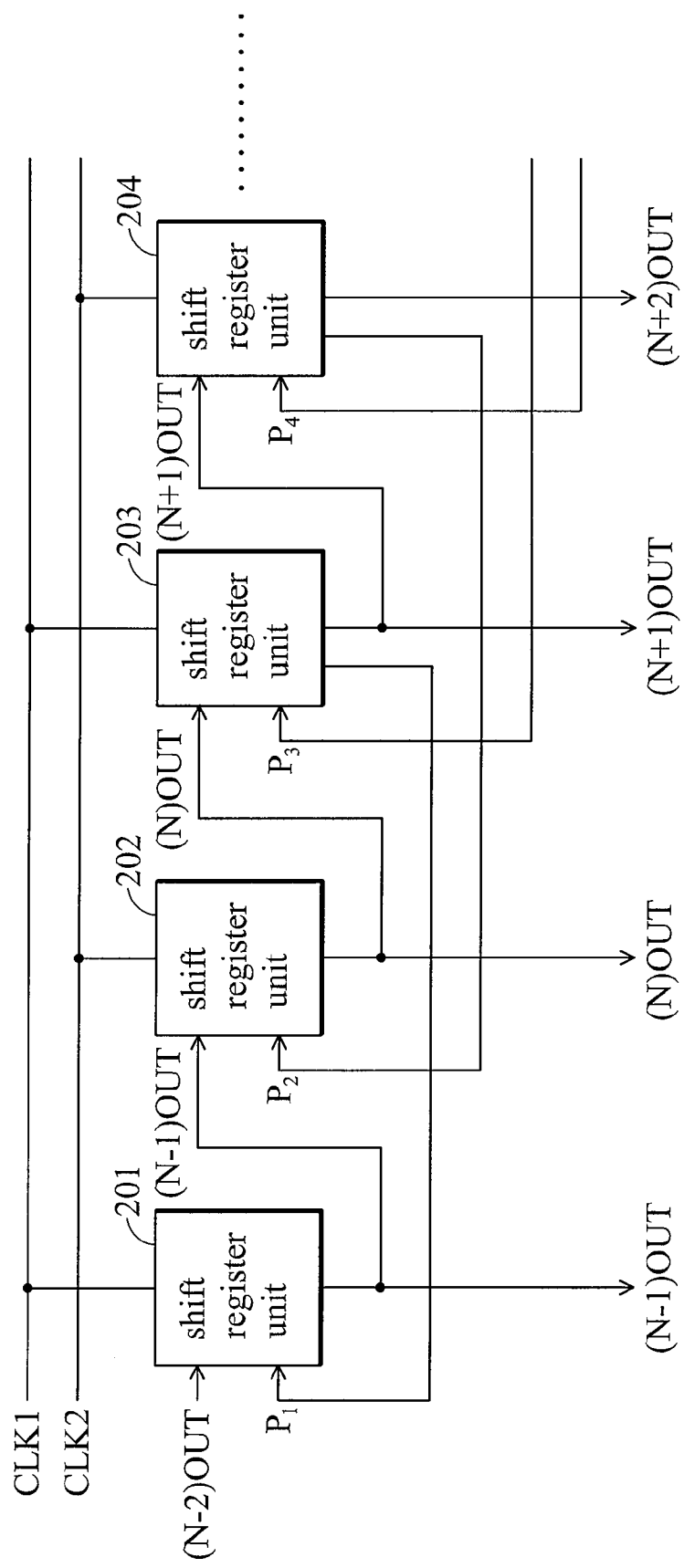
FIG. 3A shows a shift register circuit according to an embodiment of the present invention.

FIG. 3A shows a shift register circuit according to an embodiment of the present invention. For simplification, FIG. 3 shows only four stage shift register circuits as an example. A complete shift register circuit comprises a plurality of shift register circuits. As shown in FIG. 3A, shift register unit 201 comprises three receiving terminals to respectively receive output signal (N−2)OUT from a former stage shift register unit ((N−2)th stage), pull down control signal P1 from next two stage shift register unit 203 ((N+1)th stage), and first clock signal CLK1. Shift register unit 202 comprises three receiving terminals to respectively receive output signal (N−1)OUT from former stage shift register unit 201 ((N−1)th stage), pull down control signal P2 from next two stage shift register unit 204 ((N+2)th stage), and second clock signal CLK2. Shift register unit 203 comprises three receiving terminals to respectively receive output signal (N)OUT from former stage shift register unit 202 (Nth stage), pull down control signal P3 from subsequent two stage shift register unit ((N+3)th stage), and first clock signal CLK1. Shift register unit 204 comprises three receiving terminals to respectively receive output signal (N+1)OUT from former stage shift register unit 203 ((N+1)th stage), pull down control signal P4 from next two stage shift register unit ((N+4)th stage), and second clock signal CLK2.

Figure 3B:
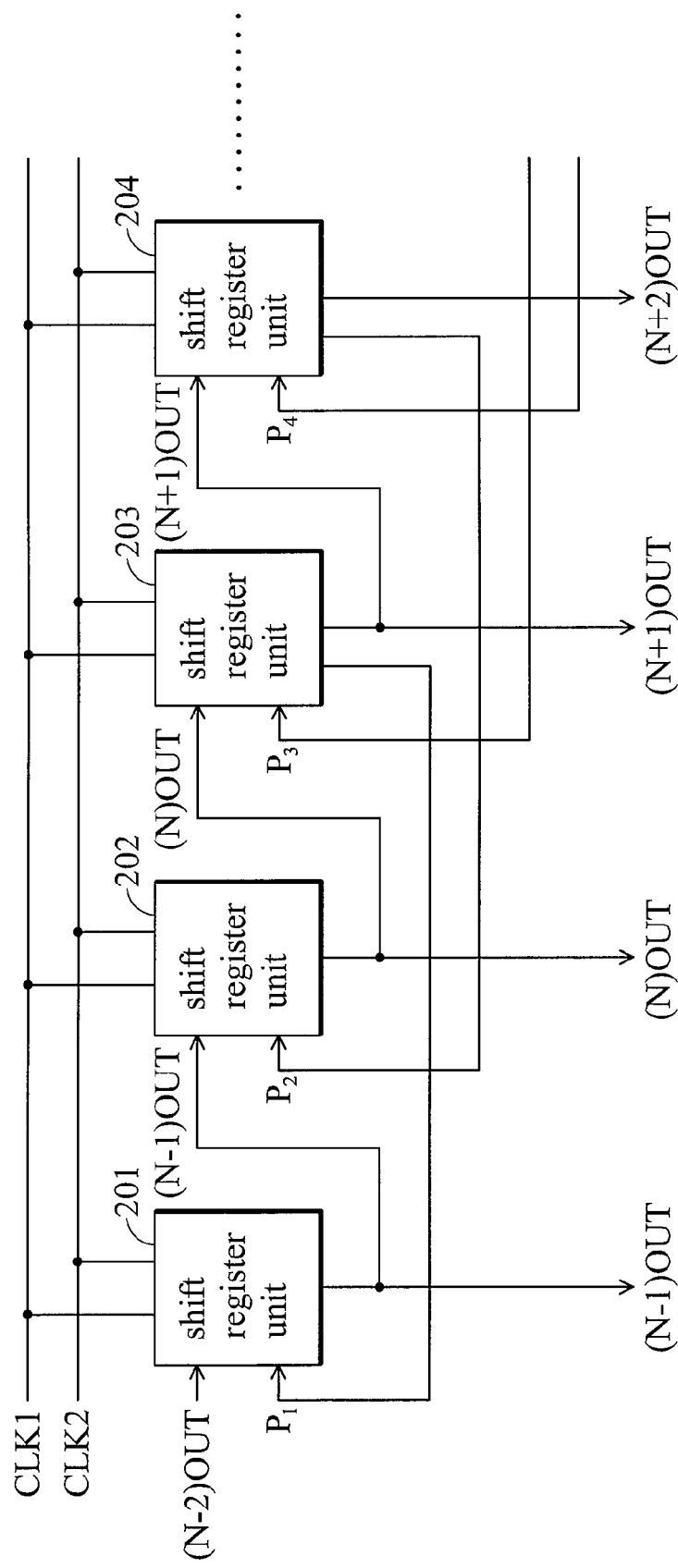
FIG. 3B shows a shift register circuit according to another embodiment of the present invention.

FIG. 3B shows a shift register circuit according to another embodiment of the present invention. Most elements in FIG. 3A and FIG. 3B are the same. Unlike FIG. 3A, however, each stage shift register unit in FIG. 3B has two receiving terminals to receive first clock signal CLK1 and second clock signal CLK2.

Figure 4:
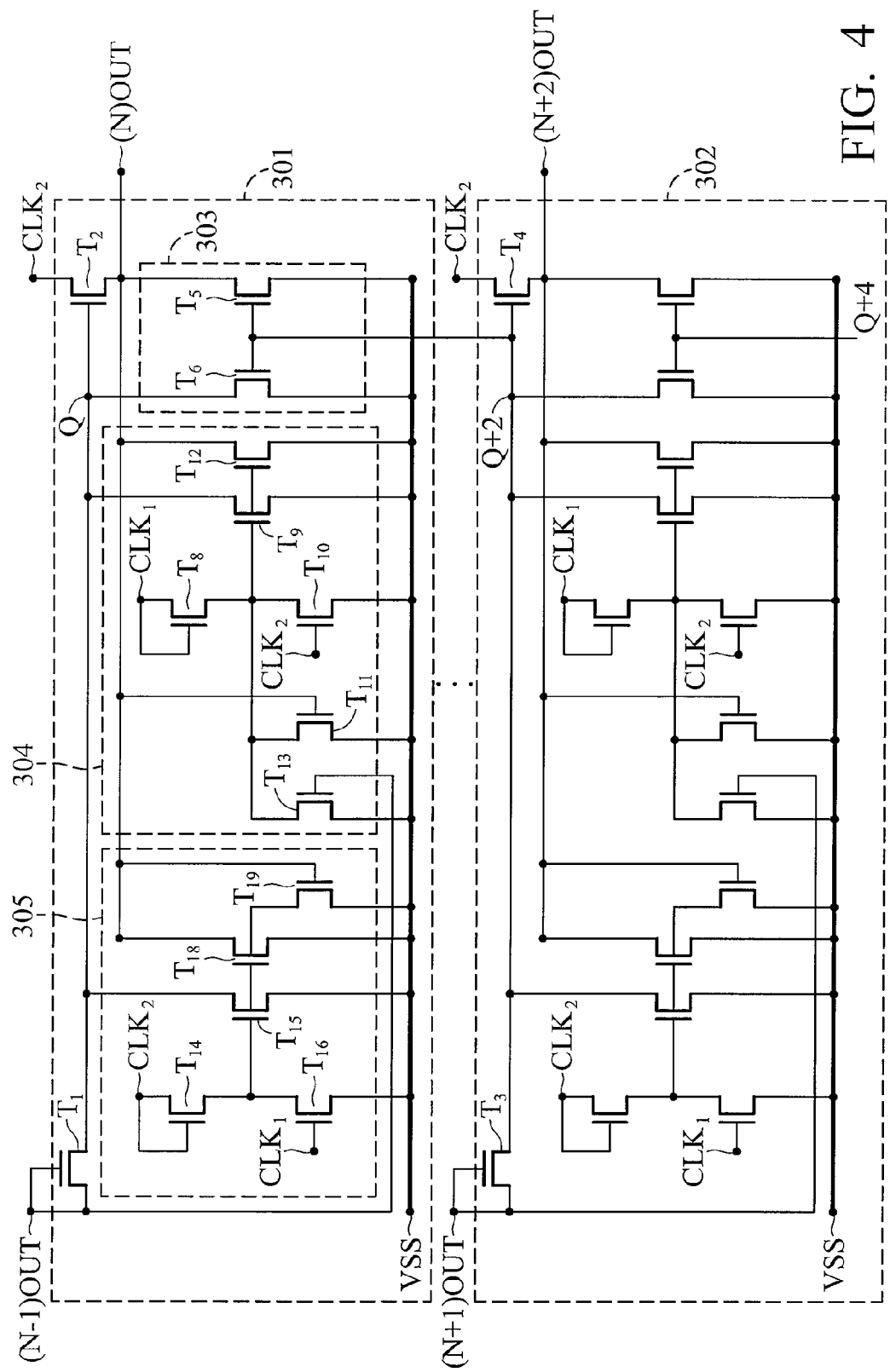
FIG. 4 shows a shift register circuit according to another embodiment of the present invention.

FIG. 4 shows a shift register circuit according to another embodiment of the present invention. For simplification, FIG. 4 only shows second shift register unit 301 and fourth shift register unit 302 and operations thereof. As shown in FIG. 4, in second shift register unit 301, switch element T1 comprises a control terminal electrically coupled to last stage ((N−1)th stage) output terminal (N−1)OUT, a first terminal, and a second terminal. Switch element T2 comprises a control terminal electrically coupled to the second terminal of switch element T1, a first terminal electrically coupled to second clock signal CLK2, and a second terminal electrically coupled to output terminal N(out) of second shift register unit 301. In other words, first terminal of switch element T2 for receiving second clock signal CLK2. In fourth shift register unit 302, switch element T3 comprises a control terminal electrically coupled to last stage ((N+1)th stage) output terminal (N+1)OUT, a first terminal, and a second terminal. Switch element T4 comprises a control terminal electrically coupled to the second terminal of switch element T1, a first terminal electrically coupled to second clock signal CLK2, and a second terminal electrically coupled to output terminal N+2(out) of fourth shift register unit 302. In other words, first terminal of switch element T4 for receiving second clock signal CLK2. The voltage level of the second terminal of switch element T3 and connected node (Q+2) of the control terminal of switch element T4 can be pulled down by a pull down signal.

As shown in FIG. 4, pull down unit 303 of second shift register unit 301 is electrically coupled between second switch element T2 and low reference voltage VSS. The voltage level of output terminal (N−1)OUT of second shift register 301 is pulled down according to the pull down signal. Pull down unit 303 is shown in FIG. 4 according to an embodiment of the present invention. Switch element T6 comprises a control terminal controlled by the pull down signal, a first terminal electrically coupled to the second terminal of switch element T2, and a second terminal electrically coupled to low reference voltage VSS. Switch element T5 comprises a control terminal controlled by the pull down signal, a first terminal electrically coupled to the second terminal of switch element T2, and a second terminal electrically coupled to low reference voltage VSS. According to another embodiment of the present invention, pull down unit 303 can be only switch element T6 and comprise a control terminal controlled by the pull down signal, a first terminal electrically coupled to the second terminal of switch element T2, and a second terminal electrically coupled to low reference voltage VSS. According to another embodiment of the present invention, pull down unit 303 can be only switch element T5 and comprise a control terminal controlled by the pull down signal, a first terminal electrically coupled to the second terminal of switch element T2, and a second terminal electrically coupled to low reference voltage VSS. The pull down units can be located in each shift register unit. Here, only second shift register unit 301 is discussed, as an example.

Figure 5:
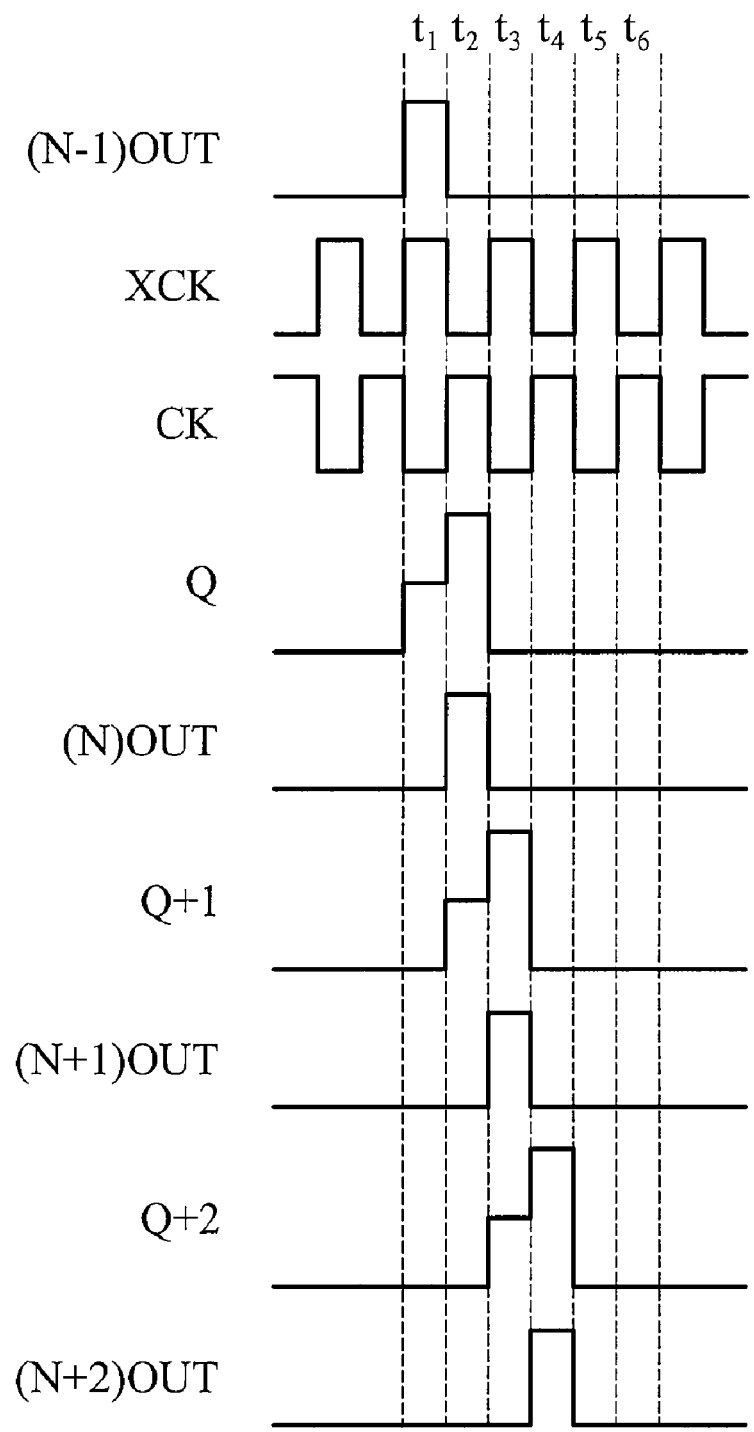
FIG. 5 is a timing diagram of a driving circuit of a shift register according to an embodiment of the present invention.

FIG. 5 is a timing diagram of a driving circuit of a shift register according to an embodiment of the present invention. As shown in FIG. 5, during period t1, output signal (N−1)OUT of the last stage shift register unit is high voltage level and switch element T1 is turned on. The high voltage level of output signal (N−1)OUT of the last stage shift register unit is transmitted to connected node Q of switch element T1 and switch element T2. At this moment, due to coupled capacitors of node Q are charged to a first voltage level, switch element T2 is turned on. At the same time, clock signal CLK2 is low voltage level. Output signal (N)OUT of second shift register unit 301 is low voltage level. During period t2, output signal (N−1)OUT of the last stage shift register unit is low voltage level. Switch element T1 is turned off. At this moment, coupled capacitors of node Q maintain node Q at the first voltage level. Switch element T2 is still turned on. The high voltage level of clock signal CLK2 is transmitted to output N(OUT) of second shift register unit 301. This stage outputs high. At this moment, the voltage level of node Q comprise the first voltage level and high voltage level signal from output N(OUT) of second shift register unit 301 to form a second voltage level. During period t3, switch element T3 receives a high voltage level signal from output (N+1)OUT of third shift register unit 203. Switch element T3 is turned on and transmits a third voltage level to connected node Q+2 of switch elements T3 and T4. Switch elements T5 and T6 are turned on by the third voltage level. The control terminal and the second terminal of switch element T2 are pulled down to low reference voltage VSS. During period t4, the voltage level of connected node Q+2 of switch elements T3 and T4 is pulled up to a fourth voltage level to maintain switch elements T5 and T6 in an on state. The control terminal and the second terminal of switch element T2 are continuously pulled down so as to maintain second shift register unit 301 to output low reference voltage VSS. As discussed, if there is only switch element T5, the second terminal of switch element T2 is pulled down to low reference voltage VSS because switch element T5 is turned on by the third voltage level. If there is only switch element T4, the control terminal of switch element T2 is pulled down to low reference voltage VSS because switch element T4 is turned on by the third voltage level.

As shown in FIG. 4, first pull down system 304 of second shift register unit 301 is electrically coupled between switch element T2, low reference voltage VSS, and the control terminal of switch element T1. Pull down system 304 is shown in FIG. 4 according to an embodiment of the present invention. Switch element T8 comprises a control terminal electrically coupled to first clock signal CLK1, a first terminal, and a second terminal. In other words, control terminal of switch element T8 for receiving first clock signal CLK1. Switch element T9 comprises a control terminal electrically coupled to the second terminal of switch element T8, a first terminal electrically coupled to the control terminal of switch element T2, and a second terminal electrically coupled to low reference voltage VSS. When first clock signal CLK is high voltage level (period t1, t3 and t5 in FIG. 5), switch element T8 is turned on. Because first clock signal CLK1 is transmitted to the control terminal of switch element T9, switch element T9 is turned on, and the voltage level of the control terminal of switch element T2 is pulled down to low reference voltage VSS. Switch element T12 comprises a control terminal electrically coupled to the second terminal of switch element T8, a first terminal electrically coupled to the second terminal of switch element T2, and a second terminal electrically coupled to low reference voltage VSS. Pull down system 304 comprises switch element T10. Switch element T10 comprises a control terminal for receiving second clock signal CLK2, a first terminal electrically coupled to the second terminal of switch element T8, and a second terminal electrically coupled to low reference voltage VSS. When second clock signal CLK2 is high voltage level, switch element T10 is turned on. The control terminals of switch element T9 and switch element T12 are pulled down to low reference voltage VSS and switch elements T9 and T12 are turned off. In order to stop first pull down system 304 from pulling down the voltage level of output signal N(OUT), pull down system 304 further comprises switch element T11. Switch element T11 comprises a control terminal electrically coupled to second terminal of switch element T2, a first terminal electrically coupled to the second terminal of switch element T8, and a second terminal electrically coupled to low reference voltage VSS. When output signal N(OUT) is high voltage level, switch element T11 is turned on. Switch elements T9 and T12 are turned off and the voltage level of switch element T2 can't pulled down. Switch element T13 comprises a control terminal electrically coupled to the first terminal of switch element T1, a first terminal electrically coupled to, the second terminal of switch element T8, and a second terminal electrically coupled to low reference voltage VSS. When output signal (N−1)OUT is high voltage level, switch element T13 is turned on. Switch elements T9 and T12 are turned off and the voltage level of switch element T2 can't pulled down.

As shown in FIG. 4, second pull down system 305 of second shift register unit 301 is coupled between switch element T2 and low reference voltage VSS. Pull down system 305 is shown in FIG. 4 according to an embodiment of the present invention. Switch element T14 comprises a control terminal for receiving second clock signal CLK2, a first terminal, and a second terminal. Switch element T15 comprises a control terminal electrically coupled to the second terminal of switch element T14, a first terminal electrically coupled to the control terminal of switch element T2, and a second terminal electrically coupled to low reference voltage VSS. When second clock signal CLK2 is high voltage level (period t2, t4 and t6 in FIG. 5), switch element T14 is turned on. Because second clock signal CLK2 is transmitted to the control terminal of switch element T15, switch element T15 is turned on and the voltage level of the control terminal of switch element T2 is pulled down to low reference voltage VSS. Switch element T18 comprises a control terminal electrically coupled to the second terminal of switch element T14, a first terminal electrically coupled to the second terminal of switch element T2, and a second terminal electrically coupled to low reference voltage VSS. Pull down system 305 comprises switch element T16. Switch element T16 comprises a control terminal for receiving first clock signal CLK1, a first terminal electrically coupled to the second terminal of switch element T14, and a second terminal electrically coupled to low reference voltage VSS. When first clock signal CLK1 is high voltage level, switch element T16 is turned on. The control terminals of switch element T15 and switch element T18 are pulled down to low reference voltage VSS and switch elements T15 and T18 are turned off. In order to stop second pull down system 305 pulling down the voltage level of output signal N(OUT), pull down system 305 further comprises switch element T17. Switch element T17 comprises a control terminal electrically coupled to second terminal of switch element T2, a first terminal electrically coupled to the second terminal of switch element T14 and a second terminal electrically coupled to low reference voltage VSS. When output signal N(OUT) is high voltage level, switch element T17 is turned on. Switch elements T15 and T18 are turned off and the voltage level of switch element T2 can't pulled down.

In above circuits, the shift register unit uses signals from next two stage shift registers as a pull down signal. Since the two continuous clock signals of node Q+2 are used as pull down signals, having a high capacity for pulling down, charges of the control terminal and the second terminal of switch element T2 are discharged more clearly. Output signal (N)OUT of shift register unit is fixed at low voltage level to avoid noise interference and voltage drift. First clock signal CLK1 and second clock signal CLK2 may be two signals with different duty cycles. In other words, the duty cycle may be respectively to use 60%/40%, 40%/60%, or others. Preferably, duty cycle is 50% in the embodiment of present invention. And the phase of first clock signal CLK1 is opposite to that of second clock signal CLK2. In other words, the first clock signal CLK1 and the second clock signal CLK2 are inverted While the present invention has been described by way of example and in terms of the preferred embodiments, it is to be understood that the present invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register circuit, comprising:
a first shift register unit comprising a first input terminal, a first output terminal, and a first clock input terminal for receiving a first clock signal;
a second shift register unit comprising a second output terminal, a second input terminal electrically coupled to the first output terminal, and a second clock input terminal for receiving a second clock signal, the second shift register unit comprising:
a first switch element comprising a first control terminal electrically coupled to the first output terminal, a first terminal, and a second terminal;
a second switch element comprising a second control terminal electrically coupled to the second terminal of the first switch element, a first terminal for receiving the second clock signal, and a second terminal electrically coupled to the second output terminal; and
a pull down unit, electrically coupled between the second switch element and a reference voltage, for pulling down a voltage level of the second output terminal according to a pull down control signal;
a third shift register unit comprising a third clock input terminal for receiving the first clock signal, a third input terminal electrically coupled to the second output terminal, and a third output terminal; and
a fourth shift register unit comprising a fourth clock input terminal for receiving the second clock signal, a fourth input terminal electrically coupled to the third output terminal, and a fourth output terminal, the fourth shift register unit comprising:
a third switch element comprising a third control terminal electrically coupled to the third output terminal, a first terminal, and a second terminal; and
a fourth switch element comprising a fourth control terminal electrically coupled to the second terminal of the third switch element and the pull down unit, a first terminal for receiving the second clock signal, and a second terminal electrically coupled to the fourth output terminal, wherein the fourth shift register unit generates the pull down control signal according to a voltage level of a connected node of the third switch element and the fourth switch element.

2. The shift register circuit of claim 1, wherein the pull down unit comprises a fifth switch element having a fifth control terminal for receiving the pull down control signal, a first terminal electrically coupled to the second terminal of the second switch element, and a second terminal electrically coupled to the reference voltage.

3. The shift register circuit of claim 1, wherein the pull down unit comprises a sixth switch element having a sixth control terminal for receiving the pull down control signal, a first terminal electrically coupled to the second control terminal of the second switch element, and a second terminal electrically coupled to the reference voltage.

4. The shift register circuit of claim 3, wherein the pull down unit comprises a seventh switch element having a seventh control terminal for receiving the pull down control signal, a first terminal electrically coupled to the second terminal of the second switch element, and a second terminal electrically coupled to the reference voltage.

5. The shift register circuit of claim 1, further comprising:
an eighth switch element comprising an eighth control terminal for receiving the first clock signal, a first terminal, and a second terminal; and
a ninth switch element comprising a ninth control terminal electrically coupled to the second terminal of the eighth switch element, a first terminal electrically coupled to the second control terminal of the second switch element, and a second terminal electrically coupled to the reference voltage.

6. The shift register circuit of claim 5, further comprising a tenth switch element having a tenth control terminal for receiving the second clock signal, a first terminal electrically coupled to the second terminal of the eighth switch element, and a second terminal electrically coupled to the reference voltage.

7. The shift register circuit of claim 5, further comprising an eleventh switch element having an eleventh control terminal electrically coupled to the second terminal of the second switch element, a first terminal electrically coupled to the second terminal of the eighth switch element, and a second terminal electrically coupled to the reference voltage.

8. The shift register circuit of claim 5, further comprising a twelfth switch element having a twelfth control terminal electrically coupled to the second terminal of the eighth switch element, a first terminal electrically coupled to the second terminal of the second switch element, and a second terminal electrically coupled to the reference voltage.

9. The shift register circuit of claim 5, further comprising a thirteenth switch element having a thirteenth control terminal electrically coupled to the first terminal of the first switch element, a first terminal electrically coupled to the second terminal of the eighth switch element, and a second terminal electrically coupled to the reference voltage.

10. The shift register circuit of claim 1, further comprising:
a fourteenth switch element comprising a fourteenth control terminal for receiving the second clock signal, a first terminal, and a second terminal; and
a fifteenth switch element comprising a fifteenth control terminal electrically coupled to the second terminal of the fourteenth switch element, a first terminal electrically coupled to the second control terminal of the second switch element, and a second terminal electrically coupled to the reference voltage.

11. The shift register circuit of claim 10, further comprising a sixteenth switch element having a sixteenth control terminal for receiving the first clock signal, a first terminal electrically coupled to the second terminal of the fifteenth switch element, and a second terminal electrically coupled to the reference voltage.

12. The shift register circuit of claim 10, further comprising a seventeenth switch element having a seventeenth control terminal electrically coupled to the second terminal of the second switch element, a first terminal electrically coupled to the second terminal of the fourteenth switch element, and a second terminal electrically coupled to the reference voltage.

13. The shift register circuit of claim 10, further comprising an eighteenth switch element having an eighteenth control terminal electrically coupled to the second terminal of the fourteenth switch element, a first terminal electrically coupled to the second terminal of the second switch element, and a second terminal electrically coupled to the reference voltage.

14. The shift register circuit of claim 5, further comprising:
a nineteenth switch element comprising a nineteenth control terminal for receiving the second clock signal, a first terminal, and a second terminal; and
a twentieth switch element comprising a twentieth control terminal electrically coupled to the second terminal of the nineteenth switch element, a first terminal electrically coupled to the second control terminal of the second switch element, and a second terminal electrically coupled to the reference voltage.

15. The shift register circuit of claim 14, further comprising a twenty-first switch element having a twenty-first control terminal for receiving the first clock signal, a first terminal electrically coupled to the second terminal of the nineteenth switch element, and a second terminal electrically coupled to the reference voltage.

16. The shift register circuit of claim 14, further comprising a twenty-second switch element having a twenty-second control terminal electrically coupled to the second terminal of the second switch element, a first terminal electrically coupled to the second terminal of the nineteenth switch element, and a second terminal electrically coupled to the reference voltage.

17. The shift register circuit of claim 14, further comprising a twenty-third switch element having a twenty-third control terminal electrically coupled to the second terminal of the nineteenth switch element, a first terminal electrically coupled to the second terminal of the second switch element, and a second terminal electrically coupled to the reference voltage.

18. The shift register circuit of claim 1, wherein the first clock signal and the second clock signal are inverted.

* * * * *